United States Patent [19]

Bass et al.

[11] Patent Number: 4,568,189

[45] Date of Patent: Feb. 4, 1986

[54] APPARATUS AND METHOD FOR ALIGNING A MASK AND WAFER IN THE FABRICATION OF INTEGRATED CIRCUITS

[75] Inventors: John F. Bass, Sterling Park; Nelson Saks, Alexandria, both of Va.; Martin Peckerar, Silver Spring, Md.

[73] Assignee: The United States of America as represented by the Secretary of the Navy, Washington, D.C.

[21] Appl. No.: 536,125

[22] Filed: Sep. 26, 1983

[51] Int. Cl.⁴ ............................................. G01B 11/27
[52] U.S. Cl. ..................................... 356/401; 356/150
[58] Field of Search ............... 356/399, 400, 401, 150, 356/153; 250/237 G

[56] References Cited

U.S. PATENT DOCUMENTS

| | | | |
|---|---|---|---|
| 3,861,798 | 1/1975 | Kobayashi | 355/61 |
| 4,037,969 | 7/1977 | Feldman | 356/172 |
| 4,171,162 | 10/1979 | Gerard et al. | 356/400 |
| 4,193,687 | 3/1980 | Reekstin et al. | 356/150 |
| 4,251,160 | 2/1981 | Bouwhuis et al. | 356/401 |
| 4,374,914 | 2/1983 | Ahlquist | 430/22 |
| 4,376,584 | 3/1983 | Hart et al. | 356/401 |
| 4,385,839 | 5/1983 | Westell | 356/400 |

*Primary Examiner*—R. A. Rosenberger
*Attorney, Agent, or Firm*—Robert F. Beers; William T. Ellis; William R. Sharp

[57] ABSTRACT

An apparatus and method for aligning a mask and wafer in the fabrication of integrated circuits utilizing alignment patterns on the mask and wafer. Each alignment pattern comprises a plurality of parallel alignment marks which are spaced from one another such that the patterns may be superimposed so that the marks of one pattern are positioned between marks of the other pattern. When the patterns are misaligned, a moiré pattern is produced which disappears on alignment. The marks of each pattern are also disparately spaced from one another, permitting a gross to fine alignment. In aligning the patterns, each mark of one pattern is positioned between pairs of marks of the other pattern in an order corresponding to the widths of spaces defined between marks of the other pattern, progressing from the largest space width, giving gross alignment, to the smallest, giving fine alignment.

14 Claims, 6 Drawing Figures

APPARATUS AND METHOD FOR ALIGNING A MASK AND WAFER IN THE FABRICATION OF INTEGRATED CIRCUITS

BACKGROUND OF THE INVENTION

This invention relates to the fabrication of integrated circuits wherein a mask pattern is imaged onto a semiconductor wafer and more particularly to the alignment of such a mask and wafer.

In the manufacture of integrated circuits, the various devices and circuit connections are formed using a photoresist layer to protect the semiconductor substrate except in the areas where processing, such as etching or metal deposition, is desired to occur.

The photoresist layer is formed by coating the substrate with a layer of resist and then patternwise exposing the resist by passing ultraviolet light through the apertures of a pattern mask. The light causes the resist layer in the light struck areas to either harden, in the case of a negative resist, or to degrade, in the case of positive resist. The unhardened or degraded areas are then removed by a developer to expose portions of the substrate for processing. The pattern masks are usually formed of a transparent substrate with a pattern opaque areas of, for example, iron oxide or chromium formed on one surface. There are generally three types of resist printing: contact printing, proximity printing, and projection printing.

Typically, in integrated circuit fabrication utilizing the techniques described above, a multiplicity of masks with different configurations are consecutively imaged at the same location of the substrate. Between the successive imagings at the same location the substrate is subjected to the desired physical and chemical changes. Thus, a passive and/or active element is obtained which is known by the name of integrated circuit.

The accuracy with which integrated circuits are manufactured has to satisfy increasingly exacting requirements. This requires that the location at which successive masks are to be imaged on the substrate should be defined with ever increasing accuracy. Deviations greater than for example 1 micron may be prohibitive. Therefore, some means to accurately align each successive mask with the wafer substrate is usually provided.

Automatic systems to achieve alignment of mask and wafer have been proposed, but these systems are very complex and relatively slow in operation. Alternatively, faster manual systems are utilized wherein an operator positions the mask and wafer, typically such that alignment marks on the mask and wafer are somehow superimposed indicating alignment. Such an aligned condition is monitored by the operator visually by means of a microscope. For example, U.S. Pat. Nos. 4,193,687 and 3,861,798 to Reekstin et al. and Kobayashi et al. respectively, both patents incorporated herein by reference, disclose the use of alignment mark patterns on the mask and wafer which may be superimposed to produce a particular moiré pattern indicating alignment. These techniques however have serious drawbacks shared by other manual alignment systems. In particular, these prior techniques require the operator to differentiate between particular moiré patterns, a laborious, slow process causing fatigue and eye strain.

SUMMARY OF THE INVENTION

It is, therefore, an object of the present invention to provide an apparatus for aligning a mask and wafer, which achieves high precision alignment of less than 1 micron.

It is also an object of this invention to provide a method of aligning a mask and wafer which produces a minimum of operator eye strain, and which is reasonably fast in achieving alignment.

Various other objects and advantages will appear from the following description of one embodiment of the invention, and the novel features will be particularly pointed out hereinafter in connection with the appended claims.

The above objects are realized in an apparatus and method described herein which utilize an alignment mark pattern on the wafer and mask, each pattern comprising two separated groups of parallel alignment marks. The alignment marks of one pattern are positioned between the marks of the other pattern by manipulating the mask or wafer such that a moiré pattern disappears on alignment. In addition, the alignment marks of each pattern are disparately spaced from one another. That is, the center to center spacing of each mark in the patterns is uniformly incremented from one mark to the next. This permits a gross to fine alignment wherein the mask pattern marks are positioned over spaces defined between pairs of wafer pattern marks in a sequence corresponding to the space widths.

Recognition of the disappearance of a moiré pattern on alignment is a simple task for an operator which causes little eye strain and fatigue, in contrast to techniques in which the operator must differentiate between particular patterns. Also, the gross to fine alignment feature described briefly above also aids the operator in manipulation of the mask and wafer to their aligned position so as to facilitate a very fast and accurate alignment. Furthermore, since the alignment mark groups of each pattern are separated, separate horizontal and vertical alignments may be performed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

An apparatus and method of aligning a mask and wafer in the fabrication of integrated circuits are described herein which utilize alignment mark patterns on the mask and wafer which are superimposed to obtain alignment.

Figure 1:
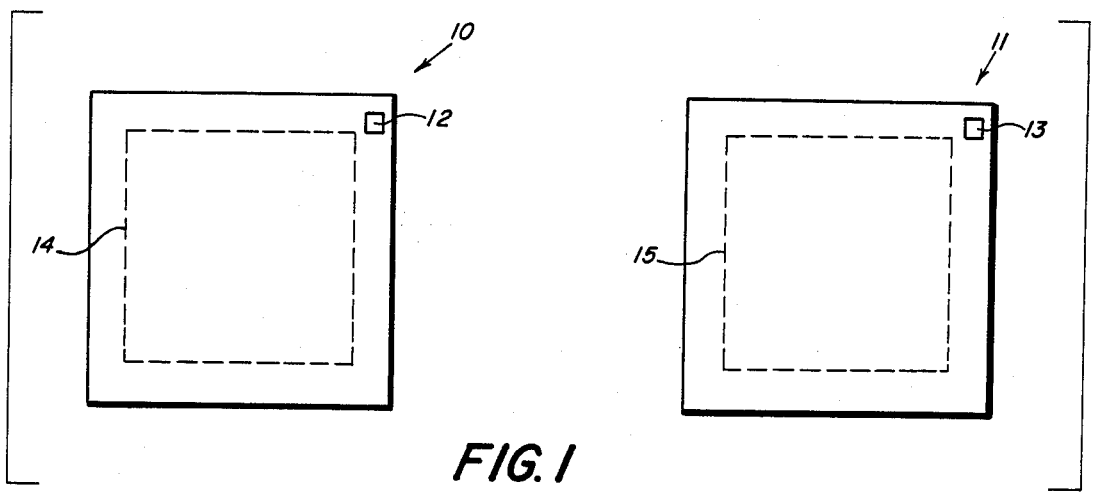
FIG. 1 is a plan view of a mask and wafer having alignment patterns outside the circuit regions.

Referring now to FIG. 1, a plan view is shown of mask 10 and wafer 11, each having circuit regions defined respectively by boundaries 14 and 15. The circuit regions are considered to be the surface area of the wafer 11 on which circuit patterns are formed and the surface area of the mask 10 bearing a pattern to be imaged onto wafer 11. Mask 10 comprises, for example, a glass substrate having a selectively patterned film of chromium or iron oxide deposited thereon in the circuit region, and an alignment pattern shown schematically at 12 outside the circuit region. Wafer 11 comprises a semiconductor substrate and a layer of photoresist formed on the top surface of the substrate, and an alignment pattern 13 outside the circuit region formed in the wafer substrate.

Figure 2:
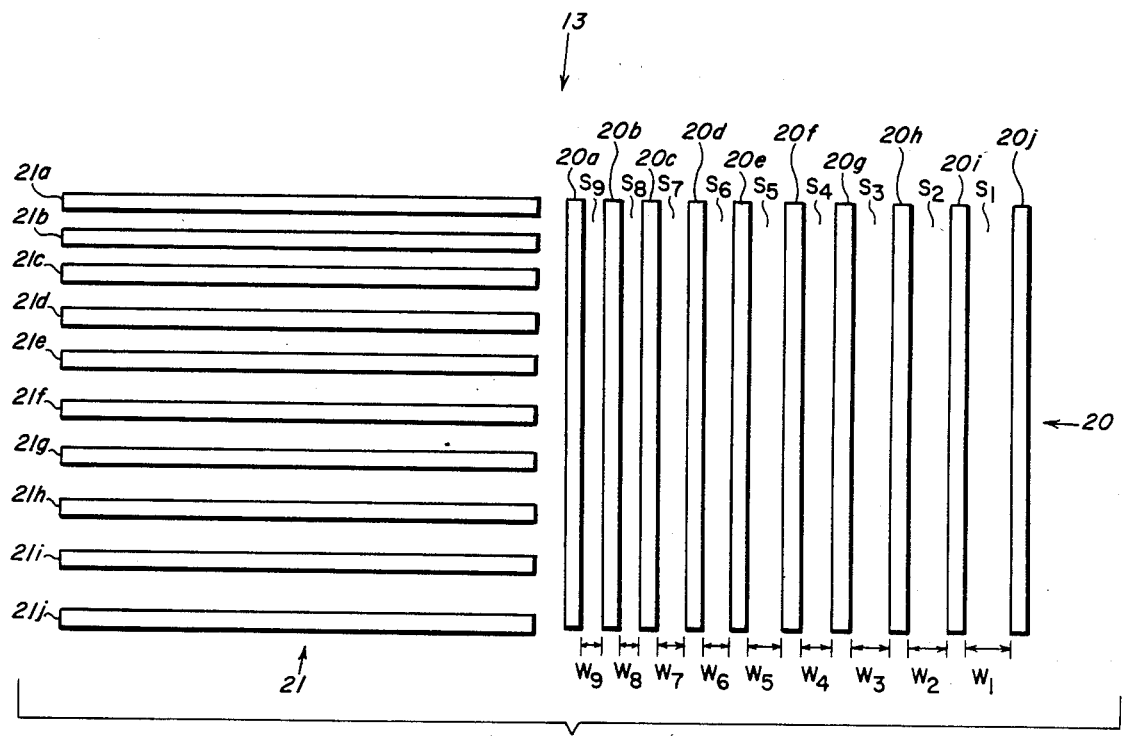
FIG. 2 is a close-up view of the wafer alignment pattern.

Turning now to FIG. 2, there is shown alignment pattern 13 comprising alignment mark groups 20 and 21. As shown, alignment mark group 20 includes a plurality, in this particular embodiment ten, of parallel alignment marks 20a–j, and alignment mark group 21 includes a plurality of parallel alignment marks 21a–j oriented so as to be perpendicular to marks 20a–j. Both alignment groups 20 and 21 are separated from one another such that no marks of group 20 intersect the marks of group 21. Even though ten marks are shown in each alignment mark group 20 and 21, a different number may be used with essentially equivalent results. Each alignment mark may be, by way of example, 1–5 microns in width and about 25–150 microns in length. Although the above mark dimensions have been found to give the best results, other dimensions outside the stated ranges may be workable.

As shown, spaces $S_1$–$S_9$ are defined between pairs of alignment marks in group 20, such spaces having widths $W_1$–$W_9$. Alignment marks 21a–j in group 21 form spaces of dimensions identical to spaces $S_1$–$S_9$. The alignment marks in each group are disparately spaced so as to permit a gross to fine alignment as later discussed, wherein the space width progresses from the smallest width $W_9$, to the largest width $W_1$. In the particular illustrated embodiment, $W_2=W_3$, $W_4=W_5$, $W_6=W_7$, and $W_8=W_9$; and $W_1>W_2$, $W_3>W_4$, $W_5>W_6$, $W_7>W_8$, $W_9$. It should be understood that the spacing arrangement of the illustrated embodiment may be modified in many ways. For example, the marks could be spaced such that all space widths differ. The marks must be disparately spaced, however, so that a range of space widths are defined between pairs of marks so as to permit gross to fine alignment as is later explained.

Figure 3:
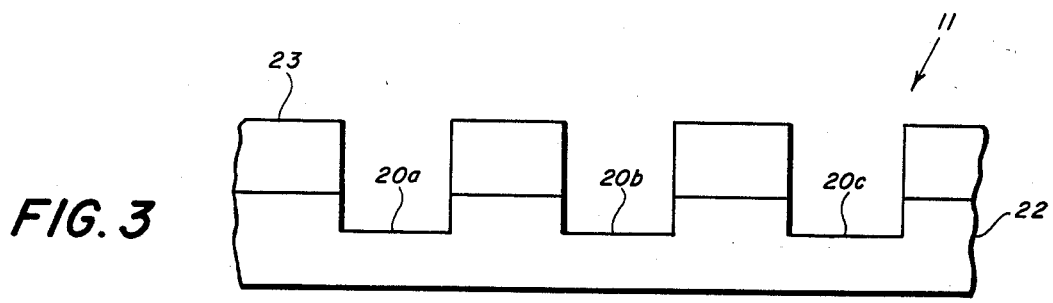
FIG. 3 is a cross sectional view of the wafer substrate and upper photoresist layer after alignment mark grooves have been formed in the substrate.

Referring now to FIG. 3, a cross section of wafer 11 is shown, wherein 22 denotes the wafer substrate and 23 denotes a photoresist layer, the purpose of which is later discussed. For illustrative purposes, only three alignment marks of pattern 13 are depicted, namely 20a, 20b, and 20c which are shown as being grooves formed in substrate 22. All of the alignment marks of pattern 13 are formed similarly. The substrate in which the marks are formed may be, by way of example, a material such as silicon. Alternatively, the substrate 22 may have layers of, for example, silicon dioxide and/or silicon nitride formed on its upper surface, in which case the alignment marks could be formed in these additional layers.

Typically, alignment marks are formed in wafer 11 by a photolithographic process which will now be described. First, the wafer substrate 22 is coated with photoresist 23. A mask bearing only an alignment mark pattern, identical to the pattern to be formed on wafer 11, is then positioned over the wafer 11. Ultraviolet light is directed through the mask to the wafer 11, thereby hardening the photoresist exposed to the ultraviolet rays. The unhardened areas are then removed by a developer so as to expose certain areas of the substrate 22 corresponding to the mask pattern, followed by the step of bathing the wafer in an etching bath of, for example, HF or boric acid. The etching bath attacks the substrate in the exposed areas to form grooves which comprise the wafer alignment marks. As will later be discussed in detail, the alignment pattern 12 and 13 are superimposed in a particular fashion indicating alignment of the mask 10 and wafer 11.

Figure 4:
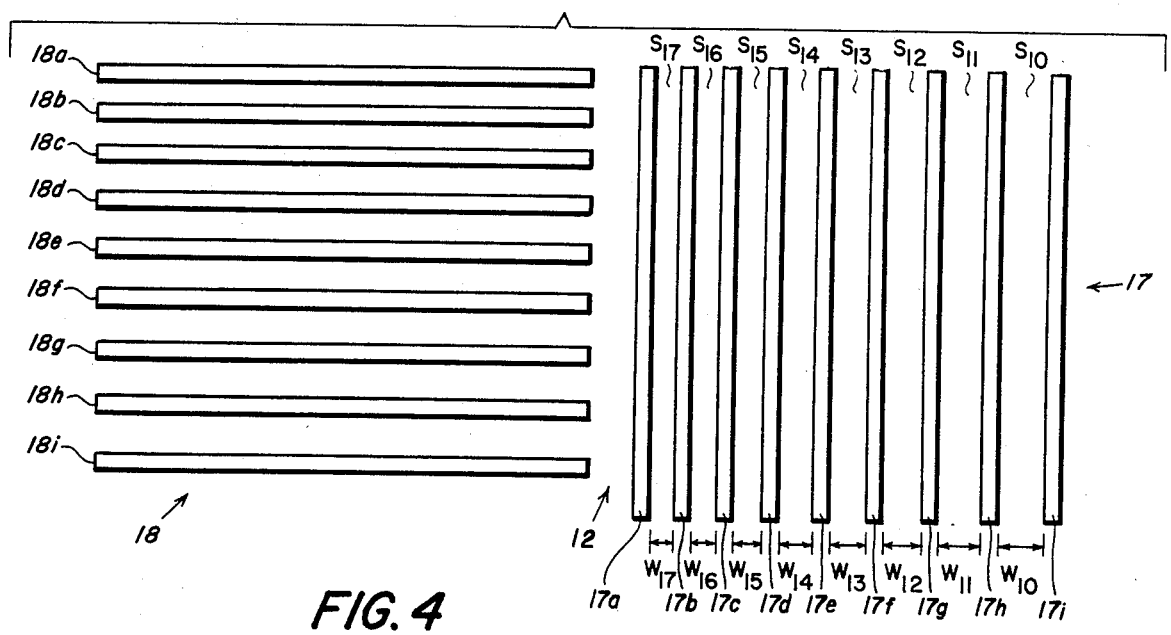
FIG. 4 is a close-up view of the the mask alignment pattern.

Turning now to FIG. 4, there is shown alignment pattern 12, which is formed on a surface of mask 10. Pattern 12 comprises two alignment mark groups 17 and 18, wherein the first group includes parallel alignment marks 18a–i whereas the second group comprises parallel alignment marks 17a–i oriented so as to be perpendicular to alignment marks 18a–i. Both alignment mark groups 17 and 18 are separated from one another such that no marks of group 18 intersect the marks of group 17. Even though each alignment mark group is shown as having nine marks, a different number of marks may function equally well. Alignment marks 17a–i and 18a–i are each equal in width to the alignment marks of pattern 13. As shown, spaces $S_{10}$–$S_{17}$ are defined between pairs of alignment marks in group 17, such spaces having widths $W_{10}$–$W_{17}$. Alignment marks 18a–i in group 18 form spaces of identical dimensions. The alignment marks in each group are disparately spaced, such that when pattern 12 is superimposed with pattern, 13, the alignment marks of pattern 12 can be centrally positioned in the spaces defined between pairs of marks in pattern 13. In the particular illustrated embodiment, the space widths of $S_{10}$–$S_{17}$ are related as follows:

$W_{10}>W_{11}>W_{12}>W_{13}>W_{14}>W_{15}>W_{16}>W_{17}$. The particular space widths are directly dependent on the space widths selected for the wafer alignment pattern.

It is emphasized that the spacing arrangement of the mask and wafer alignment marks is not limited to that described in the illustrated embodiment. However, the marks of each pattern must be spaced such that upon superimposition of each pattern, the alignment marks of one pattern can be positioned between marks of the other pattern so that no marks of said one pattern intersect the marks of said other pattern.

The alignment mark pattern 12 may comprise, by way of example, chromium or iron oxide, typically formed on a glass substrate as follows. A coating of for example chromium or iron oxide is deposited on a surface of the glass substrate. The coating is covered with a layer of photoresist which is exposed with light or an electron beam utilizing a conventional pattern generator. Such a pattern generator is adapted to generate a pattern so as to harden the photoresist in the desired alignment pattern areas. The resist is then developed, and the unhardened areas removed, leaving the chromium or iron oxide exposed in those areas outside the desired alignment pattern. These exposed areas of chromium or iron oxide are removed by an appropriate etching solution, thereby leaving the desired alignment pattern on the glass substrate.

Figure 5:
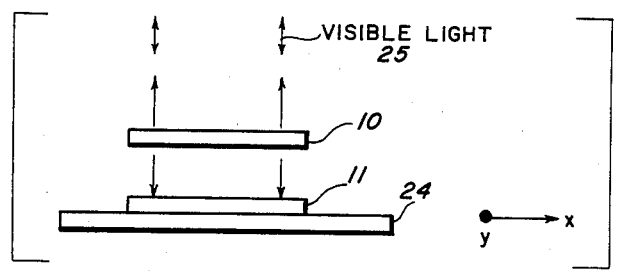
FIG. 5 is a schematic representation of an apparatus used to align the mask and wafer.

Referring now to FIG. 5, a schematic representation is shown of the apparatus for imaging a circuit pattern on mask 10 onto wafer 11. A conventional x-y table 24 is provided for supporting wafer 11, table 24 being mounted for movement in two perpendicular directions. Accordingly, the position of wafer 11 relative to mask 10 can be changed by manipulating the table 24. During the alignment process, the mask 10 and wafer 11 are illuminated by visible light, indicated at 25.

In operation, the visible light 25 which is directed on the mask 10 and wafer 11 is reflected by the mask and wafer alignment patterns 12 and 13 into the objective of a conventional microscope having a magnification power of about 100-200. An operator views the patterns 12 and 13 through the microscope, which at this point are usually grossly misaligned. To align the mask 10 and wafer 11, the wafer position is adjusted by means of x-y table 24 until the patterns 12 and 13 are roughly superimposed. A gross to fine alignment follows, employing the disparate spacing of the pattern alignment marks.

The gross to fine alignment process will now be described in reference to the alignment of alignment mark group 20 of wafer pattern 13. It should be kept in mind that alignment mark groups 18 and 21 are aligned similarly to obtain alignment of the mask 10 and wafer 11 in a direction perpendicular to the direction of alignment achieved with groups 17 and 20.

Figure 6:
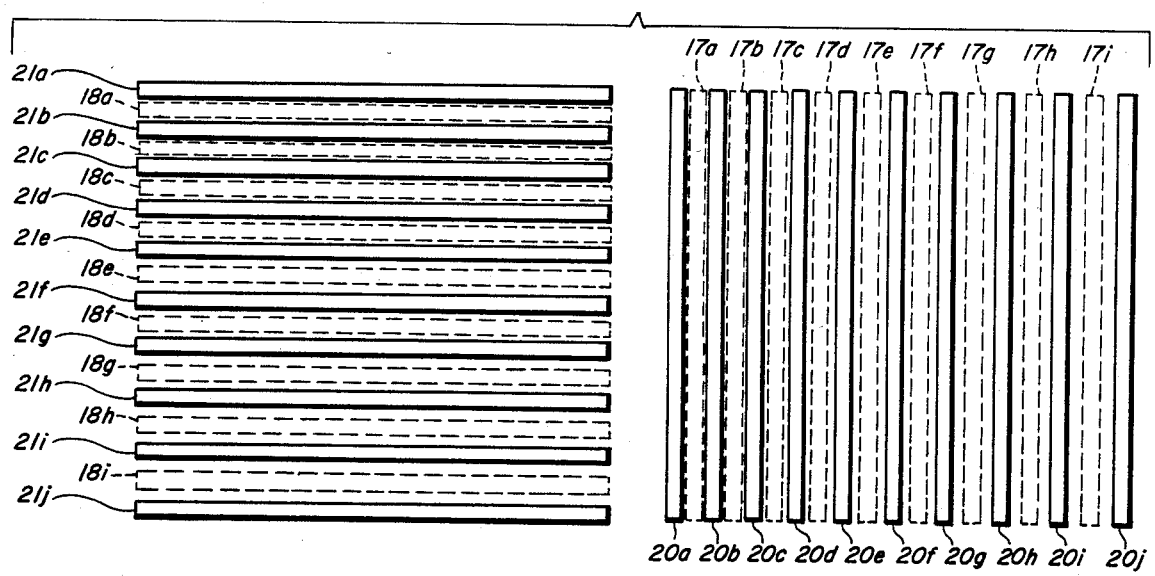
FIG. 6 is a view of the mask and wafer alignment patterns superimposed on alignment.

Referring to FIG. 6, which shows patterns (the mask pattern being shown in dashed lines for clarity of illustration) superimposed in an aligned condition wafer 11 is positioned such that mark 17$i$ is centrally positioned between marks 20$i$ and 20$j$ (in space $S_1$) thereby achieving a gross alignment, since the space defined between marks 20$i$ and 20$j$ has the largest width of all spaces defined between pairs of marks in group 20. Marks 17$g$ and 17$h$ are then centrally positioned in the spaces having the next largest width of all spaces defined between pairs of marks in group 20. Marks 17$g$ and 17$h$ are then centrally positioned in the spaces having the next largest width, in this case between marks 20$h$ and 20$i$, and between marks 20$f$ and 20$g$. Similarly, the wafer 11 is positioned so as to position the remaining mask marks of group 17 in spaces $S_4$-$S_9$ in the order of space width, progressing from the larger widths to the smallest width, in this case $S_8$ and $S_9$, wherein marks 17$a$ and 17$b$ are positioned between marks 20$a$ and 20$b$, and 20$b$ and 20$c$ in respective spaces $S_9$ and $S_8$. The final positioning of mask marks in the smallest space width achieves the most precise alignment, referred to above as fine alignment.

Stated more generally, the gross to fine alignment is obtained by positioning the alignment marks of one pattern between pairs of the other pattern alignment marks in the order of space width between alignment marks. More precisely, each alignment mark of one pattern is positioned in a space defined between a pair of the other pattern alignment marks in the following sequence, where $W_n$ denotes spaces having a particular space width, and where $W_L$ denotes the spaces having the smallest space width, and the space width decreases as n increases: $W_n$, n = 1, 2, 3, . . . , L or $W_1$, $W_2$, $W_3$, . . . , $W_L$.

An operator attempting to initially center an alignment mark between tightly spaced marks will have difficulty resolving between the tightly spaced marks, such that providing the larger spaces for initial gross alignment enables an operator to easily and quickly progress from a gross to fine alignment with a minimum of eye strain. It has been found that this feature also enhances accuracy of alignment.

In addition, misalignment of the mask pattern and wafer pattern produces a moiré pattern which disappears on alignment. Generally, a moiré pattern is produced by overlying sets of parallel lines when the sets are slightly inclined to one another. Consequently, if any alignment marks of one pattern intersect marks of the other pattern in a misaligned condition, they are necessarily inclined to one another, thereby producing a moiré pattern of dark bands. Such a moiré pattern is immediately recognizable to an operator, such that the disappearance of the moiré pattern on alignment of the mask and wafer patterns is easily detectable, further aiding in obtaining a fast and accurate alignment with a minimum of eye strain to the operator.

After the mask 10 and wafer 11 are properly aligned, the mask circuit pattern is imaged onto the wafer photoresist layer 23 in a conventional manner using ultraviolet light. Exposed areas of the photoresist are hardened in the case of a negative resist. Unhardened areas are then removed, exposing the desired areas of the wafer semiconductor substrate for processing.

Typically, additional masks are consecutively imaged at the same location of the substrate. Each successive mask is aligned with the wafer alignment pattern, as discussed above, before imaging onto the wafer 11.

There will now be described a concrete example in which a test circuit pattern was formed on a wafer utilizing alignment patterns like those shown in FIGS. 2 and 4. In respect to the mask alignment pattern: each mark in group 18 had a length of 150 microns; each mark in group 17 had a length of 145 microns; and space widths for group 17 were as follows—$W_{10}=14$, $W_{11}=13$, $W_{12}=12$, $W_{13}=11$, $W_{14}=10$, $W_{15}=9$, $W_{16}=8$, and $W_{17}=7$, all units being in microns. Space widths of group 18 were identical to those of group 17. In respect to the wafer alignment pattern: each mark in group 21 had a length of 150 microns, whereas the length of group 20 marks was 145 microns; and space widths were as follows—$W_1=15$, $W_2$ and $W_3=13$, $W_4$ and $W_5=11$, $W_6$ and $W_7=9$, $W_8$ and $W_9=7$, all units being in microns. Space widths of group 21 were identical to those of group 20. All alignment mark widths were 5 microns. The microscope was set at a magnifying power of 200. The alignment precision attained with contact printing was ±0.25 microns, wherein the precision error was arrived at utilizing National Bureau of Standards developed measuring tools.

In actual practice, a plurality of alignment patterns are usually formed on the wafer when many masks are to be imaged onto the wafer, primarily because such a multi-level process frequently destroys some of the wafer patterns. Therefore, if one of the wafer patterns is damaged, subsequent masks may be aligned with an alternate wafer alignment pattern.

Thus an improved method and apparatus for aligning a mask and wafer have been described which utilizes alignment patterns on the mask and wafer which are superimposed to obtain alignment. Alignment can be achieved with the described method and apparatus quickly, accurately, and with a minimum of eye strain to an operator by virtue of a gross to fine alignment capability and a disappearing moiré pattern characteristic on alignment.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An apparatus for high precision alignment of a mask and wafer in the production of integrated circuits which comprises:
   means for forming a moiré pattern which appears when mask and wafer are not aligned and disappears when mask and wafer are aligned said means including
   a mask pattern formed on a surface of the mask comprising a pluality of parallel alignment marks;
   a wafer pattern formed on a surface of the wafer comprising a plurality of parallel alignment marks;
   said alignment marks of each pattern being spaced from one another such that upon superposition of said mask and wafer pattern, each alignment mark of one pattern can be positioned between pairs of alignment marks of said other pattern such that the moiré pattern disappears on alignment.

2. An apparatus as recited in claim 1 wherein said mask pattern comprises first and second mask alignment mark groups, said first mask alignment mark group including a plurality of parallel alignment marks and said second mark group also including a plurality of parallel alignment marks, and wherein said wafer pattern comprises first and second wafer alignment mark groups, said first wafer group including a plurality of parallel alignment marks and said second wafer group also including a plurality of parallel alignment marks.

3. The apparatus recited in claim 2 wherein each pair of marks in said patterns defines a space therebetween having a width, the alignment marks of each alignment mark group being disparately spaced from one another such that a range of space widths are defined between pairs of marks in each alignment mark group, and wherein the center to center spacing between each mark within each group is uniformly incremented from one mark to the next mark, whereby both moiré assistance to alignment and gross to fine alignment manipulation are allowed.

4. The apparatus recited in claim 3 wherein the space width between pairs of alignment marks in each alignment mark group ranges from 7 to 15 microns.

5. The apparatus recited in claim 4 wherein said first mask alignment mark group is separated from said second mask alignment mark group and said first wafer alignment mark group is separated from said second wafer alignment mark group such that said alignment marks of said first mask alignment mark group do not intersect said marks of said second mask alignment mark group and said marks of said first wafer alignment mark group do not intersect said marks of said second wafer alignment mark group.

6. The apparatus recited in claim 5 wherein said alignment marks of each first alignment mark group are oriented so as to be perpendicular to said alignment marks of each second alignment mark group.

7. The apparatus recited in claim 6 wherein said alignment marks of said mask pattern are chromium.

8. The apparatus recited in claim 6 wherein said alignment marks of said mask pattern are iron oxide.

9. The apparatus recited in claim 6 wherein each alignment mark in said patterns is 5 microns in width.

10. The apparatus recited in claim 6 wherein the wafer includes a semiconductor substrate, wherein said alignment marks of said wafer pattern are grooves formed in a surface of the wafer substrate.

11. The apparatus recited in claim 10 wherein said alignment marks of said mask and wafer patterns are on the order of 150 microns in length.

12. In the fabrication of integrated circuits, a method of aligning a mask and wafer comprising the steps of:
   providing a mask alignment pattern on a surface of the mask, wherein the mask pattern includes a plurality of parallel alignment marks, wherein the center to center spacing between each mark in the mask pattern is uniformly incremented from one mark to the next mark;
   providing a wafer alignment pattern on a surface of the wafer, wherein the wafer pattern includes a plurality of parallel alignment marks, wherein the center to center spacing between each mark in the wafer pattern is uniformly incremented from one mark to the next mark;
   illuminating the wafer and mask alignment patterns;
   positioning the wafer and mask such that each alignment mark of one alignment pattern is positioned between pairs of the other pattern alignment marks so that none of the alignment marks of the one pattern intersect alignment marks of the other pattern, a moiré pattern being produced only when any of the alignment marks of the one pattern intersect the alignment marks of the other pattern thereby indicating misalignment, such moiré pattern disappearing on alignment.

13. The method recited in claim 12 wherein the alignment marks of each pattern are disparately spaced from one another such that in positioning the alignment marks of the one pattern between the pairs of alignment marks of the other pattern, each alignment mark of the one pattern is positioned between pairs of alignment marks of the other pattern in the order of the space width defined between alignment marks of the other pattern so as to progress from the largest space width to the smallest space width, such that alignment marks of the one pattern are positioned between alignment marks of the other pattern in the spaces defined between pairs of alignment marks of the other pattern in the following sequence, where $W_n$ denotes spaces having a particular space width, and where the space width decreases as n, an integer increases, and $W_L$ denotes spaces having the smallest space width: $W_n$, n = 1, 2, 3, ..., L; or $W_1$, $W_2$, $W_3$, ..., $W_L$.

14. An apparatus for high precision alignment of a mask and wafer in the fabrication of integrated circuits which comprises:
   a mask alignment pattern formed on a surface of the mask, said mask pattern comprising first and second mask alignment mark groups, said first group including a plurality of parallel alignment marks and said second group including a plurality of parallel alignment marks oriented so as to be perpendicular to said alignment marks of said first mask alignment mark group;
   a wafer alignment pattern formed on a surface of the wafer, said wafer pattern comprising first and second wafer alignment mark groups, said first wafer group including a plurality of parallelalignment marks and said second wafer group including a plurality of parallel alignment marks oriented so as to be perpendicular to said alignment marks of said first wafer alignment mark group; wherein each pair of marks in said patterns defines a space therebetween having a width, the alignment marks of each alignment mark group being disparately spaced from one another such that a range of space widths are defined between pairs of marks in each alignment mark group, and wherein said first mask alignment mark group is separated from said second mask alignment mark group and said first wafer alignment mark group is separated from said second wafer alignment mark group such that said alignment marks of said first mask alignment mark group do not intersect said marks of said second mask alignment mark group and said marks of said first wafer alignment mark group do not intersect said marks of said second wafer alignment mark group, said alignment marks of each pattern being spaced fron one another such that upon superposition of said mask and wafer patterns, each alignment mark of one pattern can be positioned between pairs of alignment marks of the other pattern such that no alignment marks of said one pattern intersect the alignment marks of said other pattern.

* * * * *